(12) United States Patent  (10) Patent No.: US 8,267,494 B2
Addy  (45) Date of Patent: Sep. 18, 2012

(54) AUTOMATIC RFID CIRCUIT TUNING

(75) Inventor: Kenneth Addy, Massapequa, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 443 days.

(21) Appl. No.: 12/633,953

(22) Filed: Dec. 9, 2009

(65) Prior Publication Data

US 2011/0134170 A1  Jun. 9, 2011

(51) Int. Cl.
B41J 29/38 (2006.01)
G08B 13/14 (2006.01)
(52) U.S. Cl. .......................................... 347/5; 340/572.1
(58) Field of Classification Search ......................... 347/5
See application file for complete search history.

(56) References Cited

U.S. PATENT DOCUMENTS

| | | | |
|---|---|---|---|
| 4,983,854 A | 1/1991 | Mizuno et al. | |
| 5,972,156 A | 10/1999 | Brady et al. | |
| 6,130,612 A | 10/2000 | Castellano et al. | |
| 6,147,606 A | 11/2000 | Duan | |
| 6,285,342 B1 | 9/2001 | Brady et al. | |
| 6,851,617 B2 | 2/2005 | Saint et al. | |
| 7,286,053 B1 | 10/2007 | Gudeman et al. | |
| 7,294,449 B1 | 11/2007 | Gudeman et al. | |
| 7,339,481 B2 | 3/2008 | Duron | |
| 7,387,260 B1 | 6/2008 | MacKenzie et al. | |
| 7,510,985 B1 | 3/2009 | Boenke et al. | |
| 2001/0006766 A1 | 7/2001 | O'Brien et al. | |
| 2002/0163434 A1 | 11/2002 | Burke | |
| 2005/0045723 A1 | 3/2005 | Tsirline et al. | |
| 2006/0055542 A1 | 3/2006 | Forster et al. | |
| 2006/0086807 A1 | 4/2006 | Anderson et al. | |
| 2006/0232413 A1* | 10/2006 | Lam et al. ................. | 340/572.1 |
| 2006/0250245 A1 | 11/2006 | Forster | |
| 2007/0029386 A1 | 2/2007 | Jessup | |
| 2007/0094862 A1 | 5/2007 | Posamentier | |
| 2007/0126556 A1 | 6/2007 | Subramanian et al. | |
| 2007/0130754 A1 | 6/2007 | Fein | |
| 2007/6014466 | 6/2007 | Armijo et al. | |
| 2007/0216534 A1 | 9/2007 | Ferguson | |
| 2008/0231458 A1 | 9/2008 | Fein | |
| 2008/0238673 A1 | 10/2008 | Gopalan et al. | |
| 2009/0014527 A1 | 1/2009 | Grasset et al. | |
| 2009/0015409 A1 | 1/2009 | Cheung et al. | |
| 2009/0128290 A1 | 5/2009 | Chopra et al. | |

OTHER PUBLICATIONS

Cole, Peter and Hu, Zhonghao, "Solving the Water and Metal Problem", found at http://www.rfidjournal.com/article/print/4755, printed Jun. 17, 2009, pp. 1 through 2.

Singer, Peter, "A New Approach to Low-Cost RFID Tags", found at http://www.semiconductor.net/article/203185-A_New_Approach_to_Low_Cost_RFID_Ta . . . , printed Jun. 18, 2009, p. 1.

(Continued)

Primary Examiner — Uyen Chau N Le
Assistant Examiner — Kajli Prince
(74) Attorney, Agent, or Firm — Hiscock & Barclay, LLP

(57) ABSTRACT

A method of printing comprising the steps of: providing a print media having a printing surface; measuring at least one parameter of the print media; calculating an optimal configuration for a radio frequency identification (RFID) transponder circuit for obtaining a desired RFID transponder resonant frequency; configuring the RFID transponder circuit and printing the RFID transponder circuit onto the print media.

13 Claims, 3 Drawing Sheets

OTHER PUBLICATIONS

Novak, Rodd and Ranta, Tero, "Antenna Tuning Approach Aids Cellular Handsets", found at "http://mwfr.com/Articles/Print.cfm?ArticleID+20085", printed Jun. 17, 2009, pp. 1 through 15.

Lammers, David, "Kovio Demonstrates RFID Tags Using Printed Electronics", found at "http://www.semiconductor.net/article/print/199870-Kovio Demonstrates RFID Tags Usi . . . " printed Jun. 16, 2009, pp. 1 through 3.

Author unlisted, "Kovlo Launches World's First Printed Silicon RFID Platform for Item-Level Intelligence: Technology to Build Intelligence into Everyday", found at http://www.nanotech-now.com/news.cgi?story_id+31064, posted online Oct. 19, 2009; printed Jun. 18, 2009, pp. 1 of 1 and pp. 1 and 2.

Lammers, David, Semiconductor International, "Kovio Inkjet Prints Fast Silicon Transistor", found at http://www.semiconductor.net/article/206308-Kovio_Inkjet_Prints_Fast_Silicon_Transisto . . . , printed Jun. 18, 2009, pp. 1 through 2.

Author unlisted, "Printed Electronics", found at http://www.polyid.de/en/printed-electronics.php, printed Jun. 16, 2009, p. 1.

Author unlisted, "Process", found at http://www.polyid.de/en/process.php, printed Jun. 16, 2009, p. 1.

Author unlisted, "Devices", found at http://www.polyid.de/en/devices.php, printed Jun. 16, 2009, pp. 1 through 2.

Author Unlisted, "Antenna_125.PDF", Data Sheet, (Micro RWD 125kHz Antenna Specification, ib technology, more information at http://www.ibtechnology.co.uk, pp. 1 through 4.

* cited by examiner

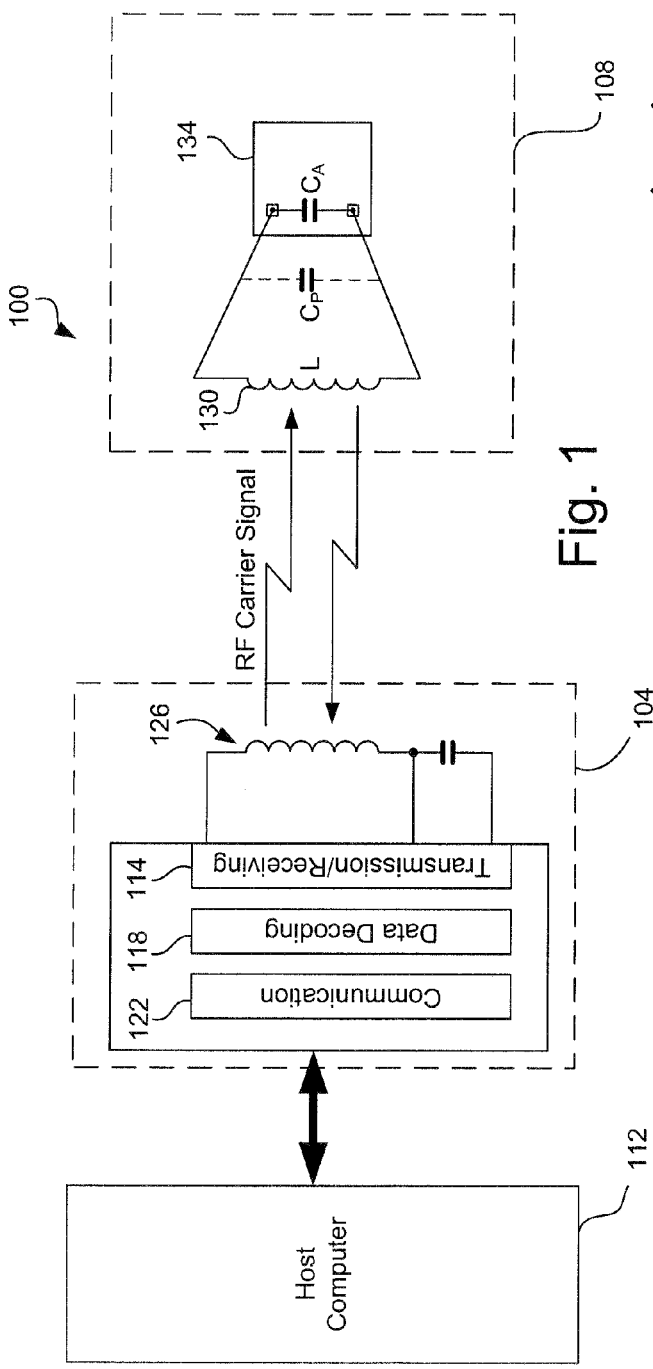
Fig. 1
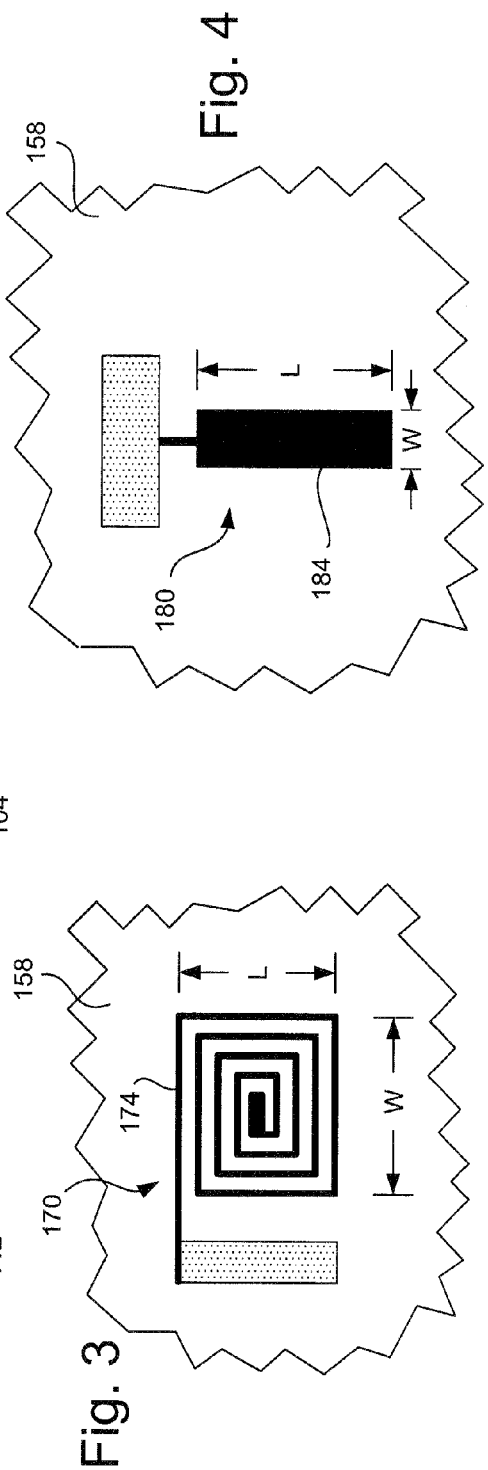
Fig. 3
Fig. 4

AUTOMATIC RFID CIRCUIT TUNING

FIELD OF THE INVENTION

This invention relates to methods of printing Radio Frequency Identification (RFID) tags.

BACKGROUND

Radio Frequency Identification (RFID) systems use radio frequency to provide a contactless data link for collecting information without need for line of sight or concerns about harsh or dirty environments that restrict other automatic ID technologies such as bar codes. RFID may also be used as a data carrier wherein information may be written to and updated on a RFID tag.

RFID systems utilize of a number of components including tags or transponders, handheld or stationary readers, data input units and system software. RFID tags come in various shapes, sizes and read ranges including thin and flexible "smart labels" which can be laminated between paper or plastic. RFID tags and labels have come in roll form wherein the tags and labels are applied to a surface for usage.

RFID has been used for many applications such as vehicle and personnel access control and tracking, vehicle security systems, product and asset tracking, supply chain automation, product payment and customer loyalty, product and asset tracking, livestock identification, document management, etc.

Efforts regarding such systems have led to continuing developments to improve their versatility, practicality and efficiency.

BRIEF DESCRIPTION OF THE DRAWINGS

FIG. 1 is a simplified schematic block diagram of an exemplary RFID system.

FIG. 3 is a top view of an exemplary RFID tag printed on a media.

FIG. 4 is a simplified plan diagram of an exemplary RFID printing system.

DETAILED DESCRIPTION

Figure 2:
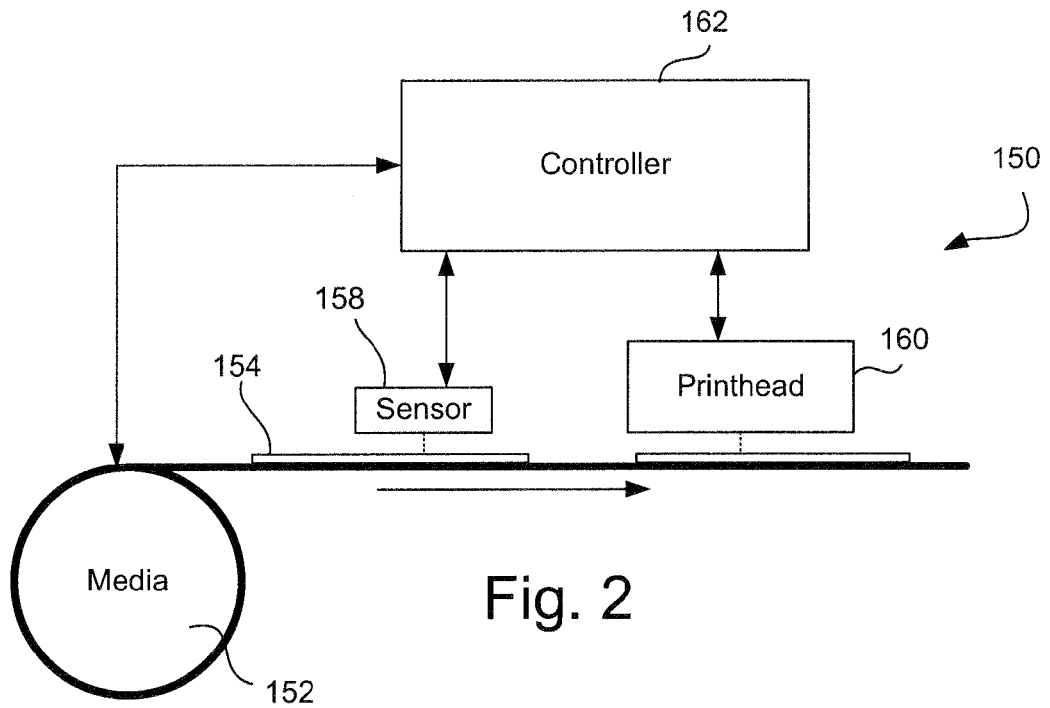
FIG. 2 is a top view of an exemplary RFID tag printed on a media.

Reference will now be made to exemplary embodiments which are illustrated in the accompanying drawings. Other embodiments may be in various forms and the exemplary embodiments should not be construed as limited to the embodiments set forth herein. Rather, these representative embodiments are described in detail so that this disclosure will be thorough and complete, and will fully convey the scope, structure, operation, functionality, and potential applicability to those skilled in the art.

Referring to FIG. 1, an exemplary passive or read only RFID system 100 may be comprised of a reader 104 or interrogator, a RFID transponder or tag 108 and host computer 112. Information stored in the memory of the transponder may not be able to be changed by RF command once it has been written.

The reader transmits an RF signal and watches for modulated backscattering signal. An exemplary RFID reader comprises a RF transmission/receiving section 114, data decoding section 118 and communication section 122 to communicate with the host computer. A processor may be utilized for controlling the transmission, receiving, data decoding and communication sections. RF transmission section comprises an RF carrier signal generator, antenna 126 and a tuning circuit.

An exemplary RFID transponder may be comprised of an antenna coil L 130, a capacitance $C_A$ which may or may not be part of a transponder circuit 134 that comprises modulation circuitry and memory. The transponder is energized by a time varying electromagnetic radio frequency (RF) wave, (referred to as a carrier signal) transmitted by the reader. A voltage is generated across the transponder antenna coil when the RF field passes through it and is utilized for operation of the transponder circuit, which becomes functional when the voltage reaches a predetermined level. Data or information stored in the device is then transmitted back to the reader, referred to as backscattering. By detecting the backscattering signal, the data stored in the transponder circuit may be read or decoded.

An exemplary antenna circuit of a transponder is comprised of a LC resonant circuit or E-field dipole antenna, depending on the RF carrier frequency. A LC resonant circuit is used for a carrier frequency of less than about 100 MHz. In this frequency band, the communication between the reader and transponder takes place with magnetic coupling between the two antennas through the magnetic field.

When the frequency is above about 100 MHz, the requirement of LC values for may become too small to realize with discrete L and C components. In this case, a true E-field antenna called an electric dipole antenna may be made of a simple conductor that has a linear dimension less than or equivalent to half (½) the wavelength of the signal. The electric dipole antenna utilizes surface current that is generated by an electric field (E-Field) to produce voltage at load that is used to energize the transponder circuit.

The voltage transfer between the reader and tag coils is accomplished through inductive coupling between the two coils. As in a typical transformer where a voltage in the primary coil transfers to the secondary coil, the voltage in the reader antenna coil is transferred to the tag antenna coil and vice versa. Read range is defined as a maximum communication distance between the reader and transponder and is related to the efficiency of the voltage transfer between the two. The read range of passive RFID systems is affected by the Q (quality factor) of the transponder antenna and tuning circuit. The efficiency of the voltage transfer and read range may be increased by increasing the Q of the circuit. A higher Q results in longer read range.

RFID transponders use resonant antenna and RF circuits. The resonant frequency of the circuitry is affected by the proximity of other material to the circuit, particularly with high Q circuits. Since the RFID transponders may be used on a variety of products, the resonant frequency of the transponders applied to different products is difficult to predict. Low Q circuits (with poorer range) may be utilized in order to avoid a de-tuning affect of the environment.

An exemplary method of producing RFID transponders is to print them with printing processes, such as inkjet printing using special inks and materials. Exemplary printed RFID ICs (also referred to as organic, chipless or polymer-based tags) are made with conductive ink that can store and transmit data. Exemplary directly printable RFID transponders involves printing RFID antenna circuitry directly on a plastic or paper media, such as packaging materials. Exemplary directly printable RFID transponders may be used on goods, labels such as pressure-sensitive adhesive labels or tags for labeling goods for transportation, containers or textiles, undetachable covers such as identification cards or access authorization cards.

Exemplary RFID transponders are comprised of paper or plastic media as the support for at least one antenna and having a circuit chip electrically connected thereto, possessing on one surface of the media a printable/writable layer comprising particulate pigment and film forming binder and on the opposite surface of the polymer film an adhesive layer covered with a cover layer.

FIG. 2 is a schematic block diagram of an exemplary RFID transponder printing system 150, wherein a print media feeder 152 feeds print media 154 for printing RFID transponder circuitry directly thereon utilizing a printhead 160. The RFID transponder circuitry may include the transistors, antenna and other required components. Prior to printing, a controller 162 controls a sensor or measurement probe 166 which measures at least one parameter of the media. The controller utilizes the measured parameter(s) to calculate the detuning effect the media would have on a RFID transponder printed thereon, and adjust or compensate the printing of the RFID transponder accordingly.

Exemplary printing techniques include inkjet printing. An inkjet printer is a type of printer that reproduces a digital image by propelling variably-sized droplets of liquid or molten material (ink) onto a print media. Inkjet technology may be thermal, piezoelectric, or continuous.

An exemplary inkjet printer uses a print cartridge or printhead with a series of tiny electrically heated chambers constructed by photolithography. To produce an image, the printer runs a pulse of current through the heating elements causing a steam explosion in the chamber to form a bubble, which propels a droplet of ink onto the print media. The ink's surface tension as well as the condensation and thus contraction of the vapor bubble, pulls a further charge of ink into the chamber through a narrow channel attached to an ink reservoir. The ink may be aqueous (i.e. water-based inks using conductive pigments or dyes).

An exemplary printing may be three-dimensional printing which prints cross-sections on top of one another.

FIG. 3 illustrates an exemplary RFID transponder 170 printed on print media 158. The antenna of the transponder may be comprised of a single N turn square loop coil 174 having an outer length L and width W.

FIG. 4 illustrates an exemplary RFID transponder 180 printed on print media 158. The antenna of the transponder may be comprised of a rectangular straight thin film inductor 184 having a length L and width W.

In an exemplary embodiment, the printing system prints RFID transponders onto packaging material. The packaging material may be plastic, corrugated box, paper bag, envelope, paperfoam, etc. The packaging material or print media adds capacitance $C_P$ to the area that is being printed on. Measurement probe 166 measures the capacitance of the area and calculates or determines an optimal configuration of the RFID transponder. Exemplary configuration determinations include the number of turns N, the length L and/or width W, height, etc. of the transponder antenna 130 or the value of the transponder capacitance $C_A$ to be printed. Once the optimal configuration determination is made, the printer prints that configuration onto the print media. The optimal determination obtains a desired or optimal resonant frequency for communicating with a predetermined reader. Thus the resonance and read range may be optimized. Other parameters, such as parameters of the inks and pigments may be measured for determining optimal resonant frequency.

An exemplary RFID transponder printer may be equipped with additional measurement capabilities for printing RFID circuitry with compensating electrical properties.

Figure 5:
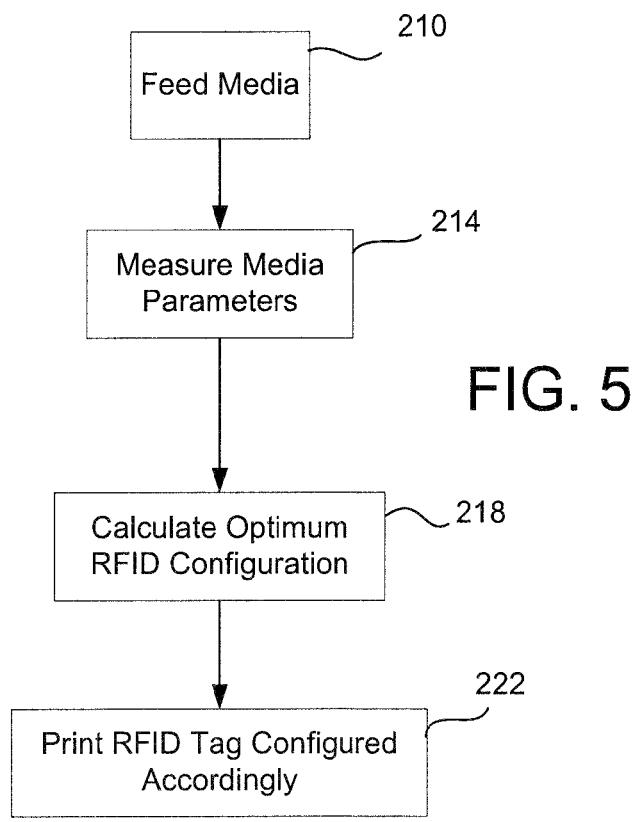
FIG. 5 is a flowchart diagram of exemplary RFID printing.

FIG. 5 is a flow diagram for an exemplary method for printing a RFID tag. Print media is fed in a step 210. A sensor measures at least one parameter of the media 214 which is utilized in a step 218 to calculate the optimal RFID antenna or circuit configuration which would yield a RFID tag with a desired predetermined resonant frequency. The properly configured RFID tag is then printed in a step 222. The sensing, calculation and printing steps may occur for each media sheet, periodic media sheets, or once at the beginning of a print job.

Figure 6:
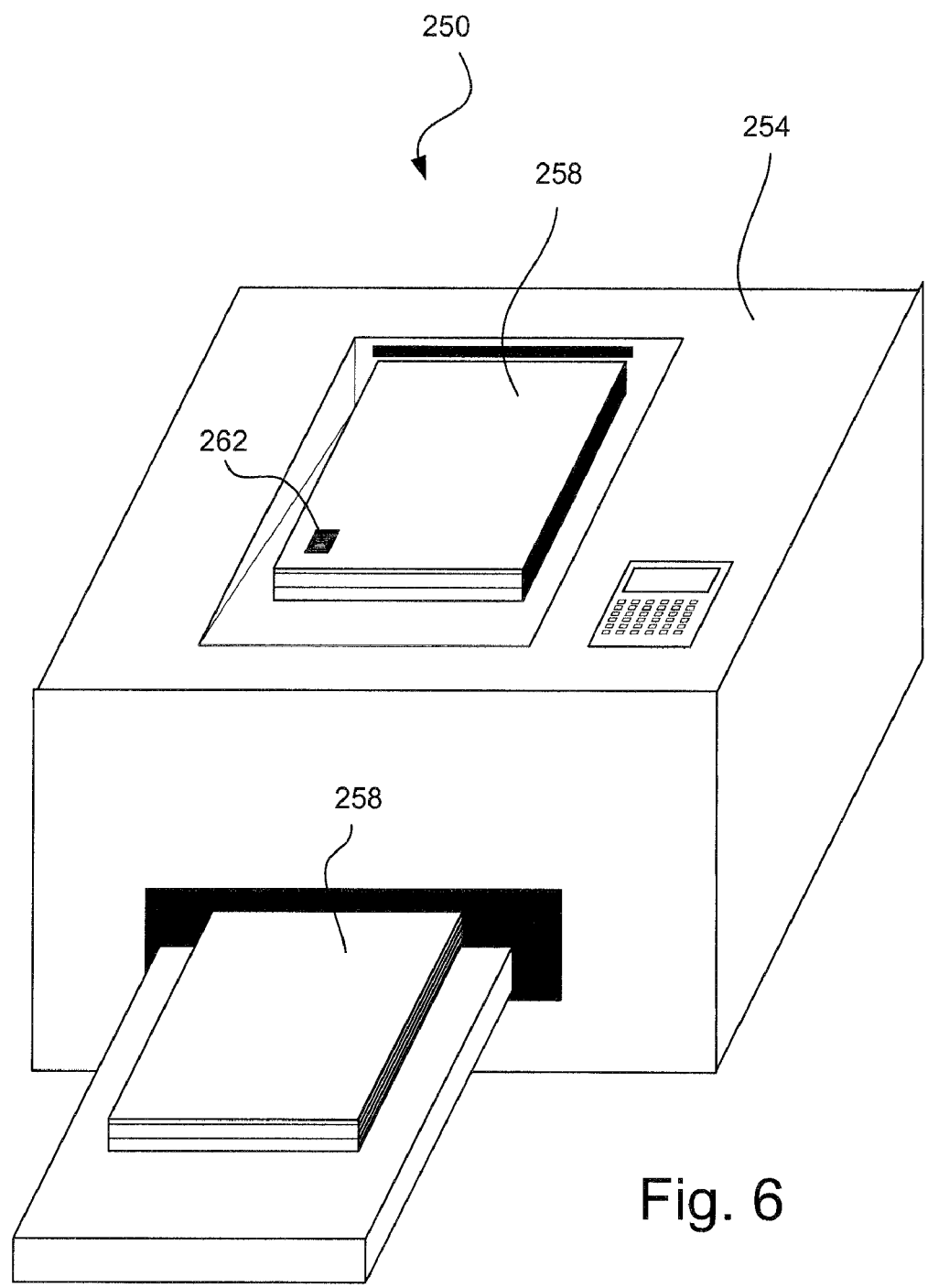
FIG. 6 shows a perspective view of an exemplary RFID printer and media prior to and subsequent to RFID printing.

FIG. 6 shows an exemplary printer system 250 with a laser printer 254 having imageable sheet media 258 both before and after being fed through the printer. Laser printer applied images 262 are printed onto the sheets.

In an exemplary printing system, the RFID tag is printed on final packaged goods, so that variation in the product within the package may also be accommodated and accounted for.

It should be understood that the programs, processes, methods and apparatus described herein are not related or limited to any particular type of computer or network apparatus (hardware or software). Various types of general purpose or specialized computer apparatus may be used with or perform operations in accordance with the teachings described herein. While various elements of the preferred embodiments have been described as being implemented in software, in other embodiments hardware or firmware implementations may alternatively be used, and vice-versa. The described embodiments are exemplary only, and should not be taken as limiting the scope of the present invention. For example, the steps of the flow diagrams may be taken in sequences other than those described, and more, fewer or other elements may be used in the block diagrams. Also, unless applicants have expressly disavowed any subject matter within this application, no particular embodiment or subject matter is considered to be disavowed herein.

The claims should not be read as limited to the described order or elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

The invention claimed is:

1. A method of printing comprising the steps of:
    providing a print media having a printing surface;
    measuring at least one parameter of the print media;
    calculating an optimal configuration for a radio frequency identification (RFID) transponder circuit, utilizing the at least one parameter, for obtaining a desired RFID transponder resonant frequency;
    configuring the RFID transponder circuit; and,
    printing the RFID transponder circuit onto the print media.

2. A method of printing in accordance with claim 1, wherein the print media is comprised of plastic or paper.

3. A method of printing in accordance with claim 1, wherein the printing is inkjet printing.

4. A method of printing in accordance with claim 1, wherein the RFID transponder circuit is comprised of a loop coil or a straight thin film inductor.

5. A method of printing in accordance with claim 1, wherein the RFID transponder circuit comprises a RFID antenna and resonant L-C circuit and the controller configures the value of the RFID antenna inductance and/or the resonant L-C circuit.

6. A method of printing in accordance with claim 1, wherein the parameter is capacitance.

7. A method of printing in accordance with claim 1, wherein the print media is comprised of final packaged goods and the calculating and configuring steps account for goods within the package.

8. A printer comprising:
a feeder for feeding print media, the print media having a printing surface;
a probe for measuring at least one parameter of the print media;
a controller for utilizing the at least one parameter to calculate an optimal configuration for a radio frequency identification (RFID) transponder circuit for obtaining a desired RFID transponder resonant frequency and configuring the RFID transponder circuit; and,
a printhead for printing the RFID transponder circuit onto the print media.

9. A printer in accordance with claim 8, wherein the printhead is an inkjet printhead.

10. A printer in accordance with claim 8, wherein the RFID transponder circuit is comprised of a loop coil or a straight thin film inductor.

11. A printer in accordance with claim 8, wherein the RFID transponder circuit comprises a RFID antenna and resonant L-C circuit and the controller configures the value of the RFID antenna inductance and/or the resonant L-C circuit.

12. A printer in accordance with claim 8, wherein the parameter is capacitance.

13. A method of printing in accordance with claim 8, wherein the print media is comprised of final packaged goods and the calculating and configuring steps account for goods within the package.

* * * * *